United States Patent
Okubo et al.

(10) Patent No.: US 6,638,684 B2
(45) Date of Patent: Oct. 28, 2003

(54) PHOTOSENSITIVE LAMINATE, PROCESS FOR FORMING RESIST PATTERN USING SAME AND POSITIVE RESIST COMPOSITION

(75) Inventors: Waki Okubo, Kanagawa (JP); Kazufumi Sato, Kanagawa (JP); Kazuyuki Nitta, Kanagawa (JP); Toshiyuki Ogata, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/799,549

(22) Filed: Mar. 7, 2001

(65) Prior Publication Data
US 2002/0045123 A1 Apr. 18, 2002

Related U.S. Application Data

(63) Continuation-in-part of application No. 09/651,099, filed on Aug. 30, 2000.

(30) Foreign Application Priority Data

Aug. 31, 1999 (JP) ............................................. 11-245684
Aug. 31, 2000 (JP) ......................................... 2000-263211

(51) Int. Cl.$^7$ ............................................. G03F 7/039
(52) U.S. Cl. .................... 430/270.1; 430/326; 430/905; 430/910
(58) Field of Search .............................. 430/270.1, 905, 430/326, 910

(56) References Cited

U.S. PATENT DOCUMENTS

| | | | |
|---|---|---|---|
| 4,491,628 A | 1/1985 | Ito et al. ..................... 430/176 |
| 5,302,490 A * | 4/1994 | Fedynyshyn et al. ..... 430/271.1 |
| 5,856,561 A | 1/1999 | Nagata et al. ................. 560/57 |
| 6,200,729 B1 * | 3/2001 | Aoai et al. ............... 430/270.1 |
| 6,274,286 B1 * | 8/2001 | Hatakeyama et al. ....... 430/189 |

FOREIGN PATENT DOCUMENTS

| | | | |
|---|---|---|---|
| DE | 43 36 009 | 4/1994 | ............. G03F/7/39 |
| EP | 0 646 568 | 4/1995 | ......... C07C/69/734 |
| JP | 4-287044 | 10/1992 | ............. G03F/7/39 |
| JP | 5-040342 | 2/1993 | ............. G03F/7/39 |
| JP | 5-313372 | 11/1993 | ............. G03F/7/39 |
| JP | 6-130670 | 5/1994 | ............. G03F/7/39 |
| JP | 8-193052 | 7/1996 | ......... C07C/69/712 |
| JP | 8-193054 | 7/1996 | ......... C07C/69/712 |
| JP | 8-193055 | 7/1996 | ......... C07C/69/712 |
| JP | 8-245515 | 9/1996 | ......... C07C/69/712 |
| JP | 7-285918 | 10/1998 | ......... C07C/69/732 |

* cited by examiner

Primary Examiner—John S. Chu
(74) Attorney, Agent, or Firm—Sughrue Mion, PLLC

(57) ABSTRACT

A photosensitive laminate includes a substrate and a resist layer 500 to 5800 angstroms thick formed on the substrate. A composition for the resist layer includes (A) a compound which generates an acid upon irradiation with radioactive ray, (B) an alkali-soluble novolak resin, and (C) a compound having at least one acid-decomposable dissolution-inhibiting group, and the dissolution-inhibiting group is decomposable by action of an acid generated from the ingredient (A) to yield an organic carboxylic acid. This photosensitive laminate is sequentially subjected to selective exposure to KrF excimer laser light or to light having a short wavelength equal to or less than that of $F_2$ laser, post-exposure baking, and developing with an alkali to yield a resist pattern.

37 Claims, No Drawings

PHOTOSENSITIVE LAMINATE, PROCESS FOR FORMING RESIST PATTERN USING SAME AND POSITIVE RESIST COMPOSITION

This is a Continuation-In-Part of application Ser. No. 09/651,099 filed Aug. 30, 2000, pending, the disclosure of which is incorporated herein by reference.

BACKGROUND OF THE INVENTION

1. Field of the Invention

The present invention relates to a photosensitive laminate, to a process for forming a resist pattern using the photosensitive laminate, and to a positive resist composition.

2. Description of the Related Art

Semiconductor devices are more and more being intensified in the degree of integration in recent years. The mass production of large-scale integrated circuits (LSIs) using 0.20-μm design rules has been already launched, and the mass production of LSIs using 0.18-μm design rules was to be launched at the end of 1999.

Various types of chemically amplified resists have been proposed. Today, the dominating chemically amplified resists are binary system resists including a base resin and an acid generator. In these binary system resists, the base resin is composed of polyhydroxystyrene which is highly transparent to KrF laser beam, whose hydroxyl group is substituted with an acid-decomposable alkali-dissolution-inhibiting group, such as a t-boc (tert-butoxycarbonyloxy) group, as proposed in Japanese Examined Patent Application Publication No. 2-27660.

Using the resist proposed in the aforementioned publication, a resist pattern is basically formed in the following mechanism.

The base resin has a t-boc group and therefore has a lower solubility in alkalis than a polyhydroxystyrene having no t-boc group. When this type of base resin is mixed with an acid generator and is selectively exposed to light, the t-boc group in exposed areas is dissociated to yield polyhydroxystyrene by action of an acid generated from the acid generator. Thus, the base resin becomes soluble in alkalis.

The alkali-solubility of the base resin in the above resist is derived from an alkali-solubility which a polyhydroxystyrene inherently possesses, and the dissociation of the t-boc group by action of an acid generated by exposure restores the alkali-solubility of the polyhydroxystyrene. Accordingly, no more alkali-solubility than that the polyhydroxystyrene inherently possesses can be expected.

In contrast, (1) Japanese Patent Laid-Open No. 4-287044, (2) Japanese Patent Laid-Open No. 5-40342, (3) Japanese Patent Laid-Open No. 5-313372, and (4) Japanese Patent Laid-Open No. 6-130670 respectively propose ternary system chemically amplified resist compositions. Each of these resist compositions is composed of (α) a novolak resin as a base resin component, (β) an acid generator, and (γ) a compound in which an acid-decomposable dissolution-inhibiting group is dissociated by actin of an acid from the acid generator to yield an organic carboxylic acid (a compound whose carboxyl group is substituted with an acid-decomposable dissolution-inhibiting group).

In such ternary system resists, as described in detail in the publications (2) and (3), a carboxylic acid is formed from the ingredient (γ) by action of an acid generated from the ingredient (B) upon exposure, and this carboxylic acid can impart more alkali-solubility to the resist than the alkali solubility which the ingredient (α) inherently possesses. Accordingly, the resulting resist exhibits a satisfactory contrast between exposed areas and unexposed areas.

However, the novolak resins used in the resists have a low transparency to KrF laser beam, and these resists are insufficient in resist pattern profile and definition and cannot be used in practice in the production of semiconductor devices where fine resist pattern sizes of not more than 0.20 μm are required.

Separately, development of resist materials for $F_2$ laser (157 nm) or extreme ultraviolet rays (EUV, extreme ultraviolet rays; 13 nm) as next-generation or next-to-next-generation resist materials is urgently necessary for the production of semiconductor devices using 0.15-μm or less design rules. Such resist compositions must have a higher dry etching resistance and an improved SEM resistance, since the energy of light used is increased in such a short wavelength region. In this connection, the formed resist pattern must be observed with a scanning electron microscope (SEM), but the formed resist pattern is deteriorated by action of an electron beam used in SEM observation. The term "SEM resistance" used herein means the resistance of the resulting resist pattern against such a electron beam in SEM observation.

Some resist compositions for light having a short wavelength equal to or less than that of $F_2$ laser beam have been proposed, but they are not sufficient solutions to the above problems.

In addition, to provide resist compositions at as low costs as possible has increased in importance in semiconductor industries, because of rapid price cuts in semiconductor devices such as 64-Mbit dynamic random access memory (DRAM) chips.

SUMMARY OF THE INVENTION

Accordingly, it is an object of the present invention to provide a photosensitive laminate especially for KrF laser, which is available at low costs, can form resist patterns with good profile, and have a satisfactory dry etching resistance and a high definition, to provide a process for forming a resist pattern using the photosensitive laminate, and to provide a positive resist composition.

Another object of the present invention is to provide a photosensitive laminate for light having a short wavelength equal to or less than that of $F_2$ laser, which has a higher dry etching resistance and an improved SEM resistance, as well as to provide a process for forming a resist pattern using the photosensitive laminate, and to provide a positive resist pattern.

The present inventors focused attention on the high contrast between exposed areas and unexposed areas of the chemically amplified positive resists described in the publications (1) to (4), and on very low costs of novolak resins as compared with polyhydroxystyrene. They found that the above object can be achieved by applying such a ternary system chemically amplified resist to a process for producing a very thin film resist 500 to 5800 angstroms thick. The present invention has been accomplished based on these findings.

In this connection, the above publications (1) to (4) neither describe nor indicate a process for producing such a very thin film resist as in the present invention.

Specifically, the invention provides, in an aspect, a photosensitive laminate including a substrate and a resist layer 500 to 5800 angstroms thick formed on the substrate. The resist layer is formed from a positive resist composition, and this positive resist composition includes (A) a compound which generates an acid upon irradiation with radioactive ray, (B) an alkali-soluble novolak resin, and (C) a compound having at least one acid-decomposable dissolution-inhibiting group, and the dissolution-inhibiting group is decomposable by action of an acid generated from the ingredient (A) to yield an organic carboxylic acid. In another aspect, the invention provides a process for forming a resist pattern. This process includes the step of sequentially subjecting the photosensitive laminate to selective exposure to KrF excimer laser or with light having a short wavelength equal to or less than that of $F_2$ laser, post exposure baking, and development with an alkali. In a further aspect, the invention provides the positive resist composition.

Further objects, features and advantages of the present invention will become apparent from the following description of the preferred embodiments.

DETAILED DESCRIPTION OF THE INVENTION

The invented photosensitive laminate includes a substrate and a resist layer 500 to 5800 angstroms thick formed on the substrate. This very thin resist layer features the invented photosensitive laminate. By this feature, the photosensitive laminate can exhibit more efficient exposure in exposure to KrF laser light or to light having a short wavelength equal to or less than that of $F_2$ laser. The photosensitive laminate can form resist patterns having markedly improved profiles and having greatly improved definition even in the production of semiconductor devices using KrF laser light where a resist pattern size of not more than 0.40 μm, especially of not more than 0.20 μm is required or in the production using light having a short wavelength equal to or less than that of $F_2$ laser where a resist pattern size of not more than 0.15 μm is required.

In addition, the use of a low-cost novolak resin can markedly reduce production costs, and the resulting photosensitive laminate exhibits a satisfactory dry etching resistance even in a very thin resist layer 500 to 5800 angstroms thick, and can be advantageously used in the production of semiconductor devices.

Such resist compositions for use in the formation of the resist layer are not limited in compositions as far as they are positive resist compositions including (A) a compound which generates an acid upon irradiation with radioactive ray, (B) an alkali-soluble novolak resin, and (C) a compound having at least one acid-decomposable dissolution-inhibiting group, and the dissolution-inhibiting group is decomposable by action of an acid generated from the ingredient (A) to yield an organic carboxylic acid. Preferred positive resist compositions for use in the invention will be described in further detail below.

The ingredient (A) is a compound which generates an acid by irradiation with radioactive ray, i.e., an acid generator. The acid generator can be freely selected from known various acid generators. Such acid generators include, but are not limited to, iodonium salts, sulfonium salts, and other onium salts; oxime sulfonates; bisalkyl- or bisaryl-sulfonyl diazomethanes; nitrobenzylsulfonates; iminosulfonates; and disulfones.

In the invention, particularly preferred acid generators are onium salts each containing a fluorinated-alkylsulfonate ion as an anion. Acids generated from such onium salts have high acid strengths and can satisfactorily decompose or dissociate the ingredient (C) mentioned below.

Cations constituting such onium salts include, for example, diphenyliodonium or triphenylsulfonium, di-lower-alkylmonophenylsulfoniums, and lower-alkyl-cyclohexyl(2-oxocyclohexyl)sulfoniums. The aforementioned diphenyliodonium or triphenylsulfonium may be substituted with a substituent such as methyl group, ethyl group, propyl group, n-butyl group, tert-butyl group, and other lower alkyl groups, or methoxy group, ethoxy group, and other lower alkoxy groups.

The anion is a fluoroalkylsulfonate ion, in which part or the whole of hydrogen atoms of an alkyl group are substituted with fluorine atoms. The strength as sulfonic acid decreases with an increasing number of constitutive carbon atoms or with a decreasing rate of fluorination (rate of fluorine atoms in the alkyl group). Accordingly, preferred fluoroalkylsulfonate ions each contain an alkyl group having 1 to 10 carbon atoms in which all the hydrogen atoms of the alkyl group are substituted with fluorine atoms (fluorinated).

Such onium salts are shown by the following formulae (III), (IV), (V), and (VI):

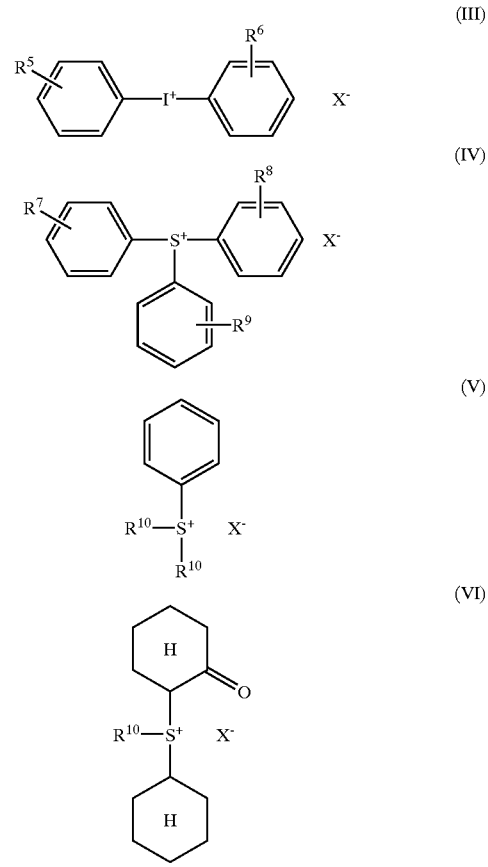

wherein each of $R^5$, $R^6$, $R^7$, $R^8$ and $R^9$ is independently a hydrogen atom, an alkyl group having 1 to 4 carbon atoms, or an alkoxy group having 1 or 2 carbon atoms; $R^{10}$ is an alkyl group having 1 to 4 carbon atoms; and $X^-$ is a fluoroalkylsulfonate ion.

Concrete examples of such onium salts include, but are not limited to, trifluorolmethanesulfonate or nonafluorobutanesulfonate of diphenyliodonium; trifluoromethanesulfonate or nonafluorobutanesulfonate of bis(4-tert-butylphenyl)iodonium; trifluoromethanesulfonate or nonafluorobutanesulfonate of triphenylsulfonium; trifluoromethanesulfonate or nonafluorobutanesulfonate of tri(4- methylphenyl)sulfonium; trifluoromethanesulfonate or nonafluorobutanesulfonate of tri(4-methoxyphenyl)sulfonium; trifluoromethanesulfonate or nonafluorobutanesulfonate of dimethylphenylsulfonium; and trifluoromethanesulfonate or nonafluorobutanesulfonate of methylcyclohexyl(2-oxocyclohexyl)sulfonium.

Of these onium salts, preferred are iodonium or sulfonium trifluoromethanesulfonate or nonafluorobutanesulfonate shown by the formulae (III) and (IV).

Each of these acid generators can be used alone or in combination.

The proportion of the ingredient (A) is 0.5 to 20 parts by weight, and preferably 5 to 15 parts by weight relative to 100 parts by weight of the ingredient (B). If the proportion of the ingredient (A) is out of this range, images cannot be sufficiently formed and resist solutions cannot be significantly homogeneously formed.

The ingredient (B) is an alkali-soluble novolak resin.

As described in the description of the related art, the use of such a novolak resin as a base resin ingredient can yield a much improved alkali-solubility than the alkali-solubility which the novolak resin originally possesses, and such a high alkali-solubility can yield a high contrast between exposed areas and unexposed areas and can attain a high definition in the process of a very thin resist film 500 to 5800 angstroms thick. This is because of an interaction between the novolak resin and a carboxylic acid derived from the ingredient (C) described below.

In addition, in this process for very thin film resist, a low transparency of the novolak resin to KrF excimer laser beam or to light having a short wavelength equal to or less than that of $F_2$ laser does not significantly deteriorate the definition.

Furthermore, the novolak resin has a three-dimensional network structure and is therefore more resistant against dry etching and has a higher SEM resistance than polyhydroxystyrene. This feature is also advantageous for the thin film resist process.

Such alkali-soluble novolak resins include, but are not limited to, those conventionally used in non-chemically amplified positive resists containing a naphthoquinonediazidesulfonyl ester and a novolak resin, and those described in the above publications.

Concrete examples of such alkali-soluble novolak resins are novolak resins obtained by condensing a phenol with an aldehyde in the presence of an acidic catalyst.

Such phenols include, but are not limited to, phenol; m-cresol, p-cresol, o-cresol, and other cresols; 2,3-xylenol, 2,5-xylenol, 3,5-xylenol, 3,4-xylenol, and other xylenols; 2,3,5-trimethylphenol, 2,3,5-triethylphenol, and other alkyl-substituted phenols. Each of these phenols can be used alone or in combination.

Of these phenols, typically preferred are m-cresol, p-cresol, 3,5-xylenol, and 2,3,5-trimethylphenol.

The aldehydes include, but are not limited to, formaldehyde, paraformaldehyde, trioxane, and formalin.

The condensate of the phenol and the aldehyde can be prepared in the presence of an acidic catalyst according to a known technique. Such acidic catalysts include, but are not limited to, hydrochloric acid, sulfuric acid, formic acid, acetic acid, oxalic acid, and p-toluenesulfonic acid.

The alkali-soluble novolak resins for advantageous use in the invention preferably have a weight average molecular weight of about 3000 to 25000, and more preferably about 5000 to 20000. The term "weight average molecular weight" as used herein is defined as the value in terms of polystyrene measured by gel permeation chromatography (GPC).

To obtain a resist pattern with a good profile at a high definition at low costs in the thin film resist process, typically preferred are m-cresol novolak resins having a weight average molecular weight of 5000 to 10000 and obtained by condensing m-cresol alone in the presence of an acidic catalyst, and cresol novolak resins having a weight average molecular weight of 5000 to 20000 and obtained by condensing a cresol mixture containing 20% to 80% by mole of m-cresol and 20% to 80% by mole of p-cresol.

The ingredient (C) is a compound having at least one acid-decomposable dissolution-inhibiting group, and the dissolution-inhibiting group is decomposable by action of an acid generated from the ingredient (A) to yield an organic carboxylic acid.

A variety of such compounds have been proposed in, for example, the publications (1) to (4), Japanese Patent Laid-Open Nos. 6-287163, 7-285918, 8-193052, 8-193054, 8-193055, 8-245515 and 9-77720. Any of these compounds can be freely employed in the invention.

The acid-decomposable dissolution-inhibiting group can be voluntarily selected from groups known in chemically amplified positive resists. The compounds in question are classified under two groups, i.e., compounds each having a phenolic hydroxyl group protected by an acid-decomposable dissolution-inhibiting group, and compounds each having a carboxyl group protected by an acid-decomposable dissolution-inhibiting group.

Specifically, such acid-decomposable dissolution-inhibiting groups include, but are not limited to, tert-butoxycarbonyl group, tert-amyloxycarbonyl group, and other tertiary-alkyloxycarbonyl groups; tert-butoxycarbonylmethyl group, tert-butoxycarbonylethyl group, and other tertiary-alkyloxycarbonylalkyl groups; tert-butyl group, tert-amyl group, and other tertiary alkyl groups; tetrahydropyranyl group, tetrahydrofuranyl group, and other cyclic ether groups; ethoxyethyl group, methoxypropyl group, and other alkoxyalkyl groups; 1-methylcyclohexyl group, 1-ethylcyclohexyl group, and other 1-lower-alkyl substituted monocycloalkyl groups, 2-methyladamantyl group, 2-ethyladamantyl group, and other lower-alkyl-substituted polycycloalkyl groups, and other alkyl-substituted cycloalkyl groups.

Among them, tert-butoxycarbonyl group, tert-butoxycarbonylmethyl group, tert-butyl group, tetrahydropyranyl group, ethoxyethyl group, 1-methylcyclohexyl group, and ethylcyclohexyl group are preferred.

Acid-decomposable dissolution-inhibiting groups for protecting a phenolic hydroxyl group include the aforementioned acid-decomposable dissolution-inhibiting groups other than the 1-alkylcycloalkyl groups.

Acid-decomposable dissolution-inhibiting groups for protecting a carboxyl group include, for example, the aforementioned acid-decomposable dissolution-inhibiting groups other than the tertiary-alkyloxycarbonyl groups.

However, the dissolution-inhibiting group must be dissociated from the ingredient (C) by action of an acid generated from the ingredient (A) to yield an organic carboxylic acid. When phenolic hydroxyl groups of a phenolic compound having no carboxylic group are protected with the dissolution-inhibiting group to yield the ingredient (C), at least one of phenolic hydroxyl groups must be protected with a tertiary-alkyloxycarbonylalkyl group or another group which generates a carboxylic acid.

When a carboxyl group of a compound having at least one carboxyl group is protected with the dissolution-inhibiting group to yield the ingredient (C), the protective group can be freely selected from the aforementioned dissolution-inhibiting groups.

More preferred ingredients (C) include (c-1) compounds having a weight average molecular weight in a range from 100 to 1500, and (c-2) polymers having a weight average molecular weight in a range from 2000 to 20000 and containing at least 2% by mole of a (meth)acrylic acid derivative unit having an acid-decomposable dissolution-inhibiting group. These preferred ingredients (C) can yield a higher definition and can form a resist pattern with a good profile at low costs in the thin film resist process.

Preferred ingredients (c-1) are bile acid esters each having at least one acid-decomposable dissolution-inhibiting group, such as cholic acid, deoxycholic acid, ursocholic acid, lithocholic acid, or compounds each having one to six substituted or unsubstituted benzene nuclei and at least one acid-decomposable dissolution-inhibiting group, and the dissolution-inhibiting group is decomposable or dissociable by action of an acid generated from the ingredient (A) to yield an organic carboxylic acid. The former bile acid esters are typically advantageously employed for the photosensitive laminate, process for forming a resist pattern, and positive resist composition for use in $F_2$ laser irradiation.

The latter ingredients (c-1) can be classified under the following three groups (i), (ii), and (iii).

(i) Compounds in which a hydrogen atom of a phenolic hydroxyl group is substituted with a tertiary-alkyloxycarbonylalkyl group. These compounds are obtained by subjecting a phenolic compound such as bisphenol A or a trisphenol to dehydrohalogenation with a tertiary alkyl ester of a halogenated fatty acid such as tert-butyl bromoacetate in the presence of an alkali catalyst. If this type of compound has plural hydroxyl groups, the other hydroxyl group(s) may be substituted with an acid-decomposable dissolution-inhibiting group other than tertiary-alkyloxycarbonylalkyl groups.

(ii) Compounds obtained by substituting biphenyldicarboxylic acid, naphthalenedicarboxylic acid, benzophenonedicarboxylic acid, and other carboxyl-group-containing compounds with an acid-decomposable dissolution-inhibiting group.

(iii) Compounds obtained by substituting a carboxyl group or hydroxyl group of 4,4'-bis(4-hydroxyphenyl)pentanoic acid or another compound having both carboxyl group and hydroxyl group with the acid-decomposable dissolution-inhibiting group. The carboxyl group and hydroxyl group in this case may be substituted with different types of acid-decomposable dissolution-inhibiting groups.

The phenolic compound in the group (i) can be freely selected from known phenolic compounds for use in the sulfonyl ester of the non-chemically amplified positive resists, and from known sensitizers for use in the positive resists just mentioned above.

Such phenolic compounds include, but are not limited to, bis(4-hydroxyphenyl)methane, bis(2,3,4-trihydroxyphenyl)methane, 2-(4-hydroxyphenyl)-2-(41-hydroxyphenyl)propane, 2-(2,3,4-trihydroxyphenyl)-2-(2',3',4-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, binuclear, trinuclear, and tetranuclear condensates of formaldehyde with phenol, m-cresol, p-cresol, xylenol, or other phenols.

The carboxyl-group-containing compound in the group (ii) can be freely selected from known carboxylic acid compounds.

Such carboxylic acid compounds include, but are not limited to, cyclohexanecarboxylic acid, benzoic acid, salicylic acid, biphenylpolycarboxylic acid, naphthalene(di)carboxylic acid, naphthalenetriacetic acid, benzoylbenzoic acid, anthracenecarboxylic acid, benzophenonedicarboxylic acid, 1-naphthylacetic acid, and a compound of the following formula:

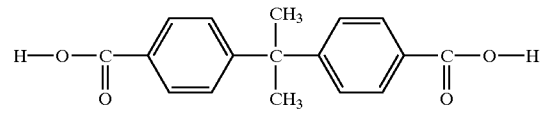

The compound having both carboxyl group and hydroxyl group in the group (iii) can be freely selected from known compounds.

Such compounds include, for example, 2,2'-bis(4-hydroxyphenyl)propionic acid, and 4,4'-bis(4-hydroxyphenyl)pentanoic acid.

More preferred latter ingredients (c-1) are classified as (c-1-1) a compound in which a hydrogen atom of at least one hydroxyl group or carboxyl group of a compound shown by the following formula (I) is substituted with an acid-decomposable dissolution-inhibiting group, and (c-1-2) a condensate of formaldehyde with at least one selected from phenol, m-cresol, p-cresol, and xylenol, and at least one hydrogen atom of whose hydroxyl groups is substituted with a tert-butoxycarbonylalkyl group.

The use of these ingredients (c-1-1) and (c-1-2) can improve the contrast of the resulting positive resist composition and can further improve the profile of resist pattern and definition.

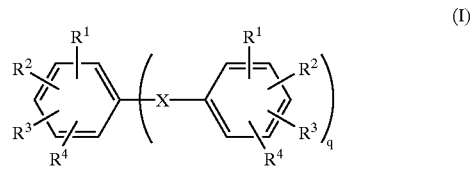

(I)

In the above formula, each of $R^1$, $R^2$, $R^3$, and $R^4$ is independently a hydrogen atom, a straight- or branched-chain or cyclic alkyl group having 6 or less carbon atoms, a lower alkoxy group, a hydroxyl group, a carboxyl group, or an alkyl group containing a carboxyl group; X is a single bond, —C(O)—, or —C($R^5$)($R^6$)—, where $R^5$ is a hydrogen atom or a lower alkyl group, and $R^6$ is a hydrogen atom, a lower alkyl group, a carboxyl group, an alkyl group containing a carboxyl group, or an aryl group shown by the following formula (II); q is 0 or 1, and the group in a parenthesis in the formula (I) is a hydrogen atom when q is 0:

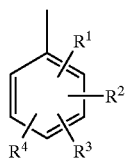

(II)

wherein $R^1$, $R^2$, $R^3$, and $R^4$ have the same meanings as defined above.

In the substituents $R^1$ to $R^6$, illustrative straight- or branched-chain or cyclic alkyl groups each having 6 or less carbon atoms include, for example, methyl group, ethyl group, n-propyl group, isopropyl group, n-butyl group, sec-butyl group, tert-butyl group, cyclopentyl group, and cyclohexyl group. Illustrative lower alkoxy groups include, but are not limited to, methoxy group, ethoxy group, and propoxy groups. Illustrative lower alkyl groups include, but are not limited to, methyl group, ethyl group, n-propyl group, isopropyl group, n-butyl group, sec-butyl group, and tert-butyl group.

The alkyl group containing a carboxyl group comprises an alkylene group having 1 to 10 carbon atoms and a carboxyl group bonded to the alkylene group. Such alkylene groups include, for example, methylene group, ethylene group, straight- or branched-chain propylene group, butylene group, hexylene group, heptylene group, and nonylene group.

Practical examples of the latter ingredients (c-1) for use in the invention include the following compounds.

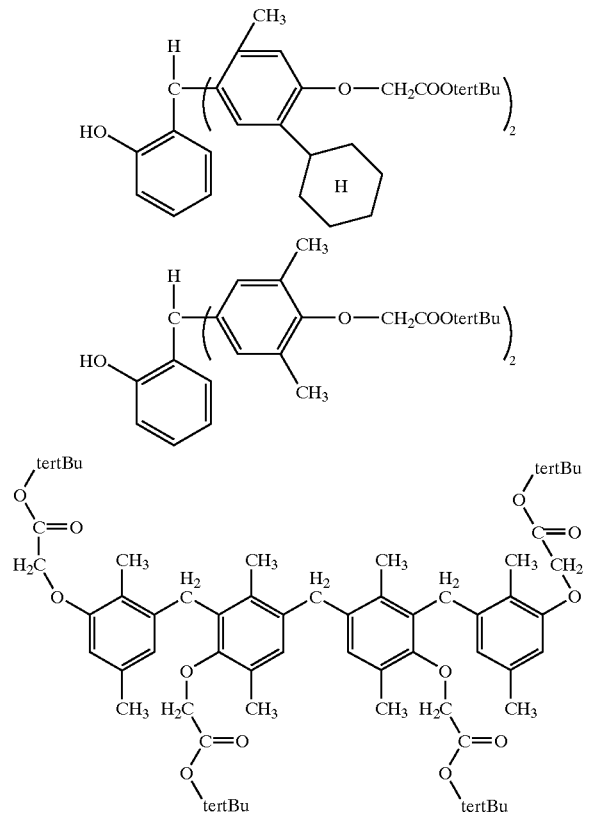

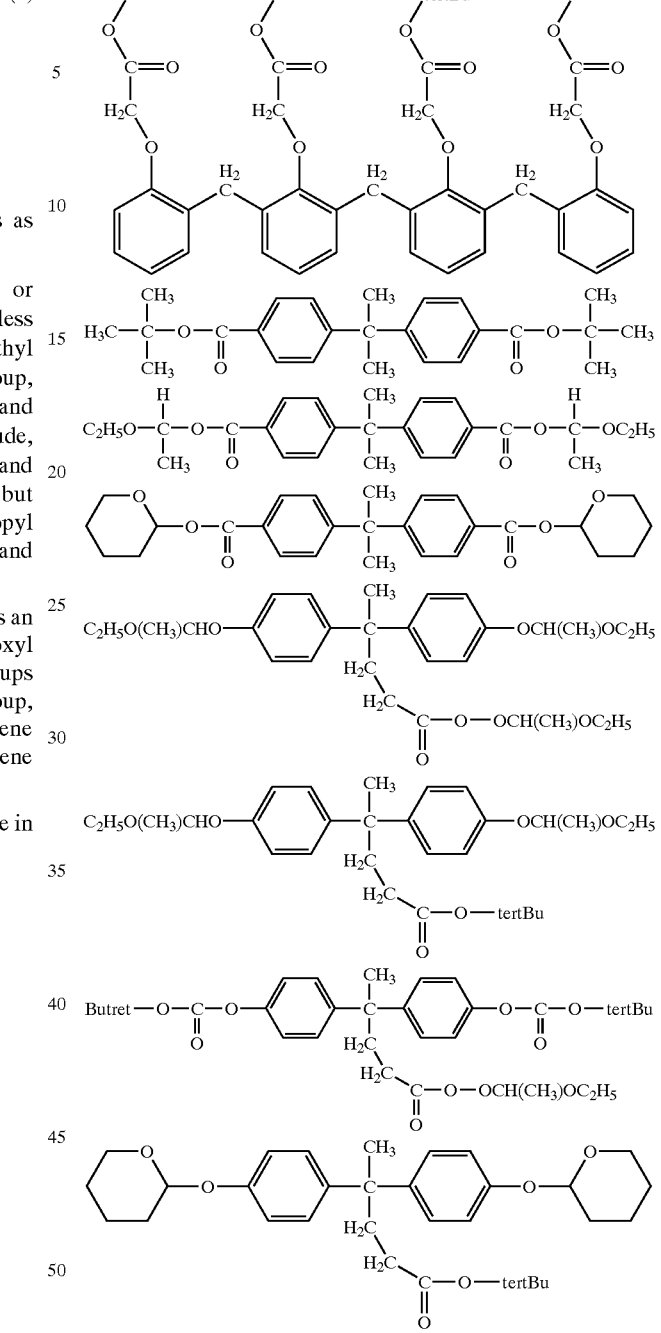

The ingredient (c-2) is a polymer containing at least 2% by mole of a (meth)acrylic acid derivative unit having an acid-decomposable dissolution-inhibiting group, and the polymer has a weight average molecular weight in a range from 2000 to 20000. Such ingredients (c-2) include (1) polymers for use as base resin ingredients of positive resists for KrF laser, having at least the (meth)acrylic acid derivative unit and a hydroxy(α-methyl)styrene unit; (2) copolymers for use as base resin ingredients of positive resists for ArF laser, having at least a unit derived from a polycyclic olefin having an acid-decomposable dissolution-inhibiting group and a unit derived from maleic anhydride; and (3) acrylic polymers for use as base resin ingredients of positive resists for ArF laser, having the (meth)acrylic acid derivative unit and having no hydroxy(α-methyl)styrene unit.

The polymers (1) to (3) will be illustrated in further detail below.

(1) Polymers having at least the (meth)acrylic acid derivative unit having an acid-decomposable dissolution-inhibiting group, and a hydroxy(α-methyl)styrene unit:

Other copolymerizable monomers constituting the polymers include, for example, styrene, (meth)acrylic acid, and methyl, ethyl, butyl, and other alkyl esters of (meth)acrylic acid. Such polymers include, but are not limited to, copolymers comprising (c-2-1) a hydroxy(α-methyl)styrene unit and (c-2-2) a (meth)acrylic acid derivative unit having an acid-decomposable dissolution-inhibiting group; and terpolymers comprising the units (c-2-1) and (c-2-2) and styrene.

The latter terpolymers preferably comprise 50% to 85% by mole of the unit (c-2-1) and each 2% to 30% by mole of the unit (c-2-2) and the styrene unit.

Among them, copolymers containing 50% to 70% by mole of the hydroxy(α-methyl)styrene unit (c-2-1) and 30% to 50% by mole of the (meth)acrylic acid derivative unit (c-2-2) having an acid-decomposable dissolution-inhibiting group are preferred. The use of these copolymers can improve the contrast of the resulting resist layer and can further improve the profile of resist pattern and definition.

If the proportion of the unit (c-2-2) exceeds the above range, the resulting resist layer shows a deteriorated solubility in a developer, and if the proportion is less than the above range, the resulting composition shows an excessively high alkali-solubility.

As the acid-decomposable dissolution-inhibiting group in the unit (c-2-2), groups similar to those exemplified in the description of the ingredient (c-1) can be employed. Among them, a unit derived from tert-butyl (meth)acrylate is preferred.

(2) Copolymers having at least a unit derived from a polycyclic olefin having an acid-decomposable dissolution-inhibiting group, and a unit derived from maleic anhydride:

Such polycyclic olefins include, but are not limited to, bicyclo[2.2.1]-2-heptene (norbornene), tetracyclo[4.4.0.1$^{2,5}$.1$^{7,10}$]-3-dodecene, and other polycyclic olefins having an ethylenic double bond. Units derived from such polycyclic olefins each having an acid-decomposable dissolution-inhibiting group are synthetically obtained from (meth)acrylic esters each having an acid-decomposable dissolution-inhibiting group and polycyclic olefins through a Diels-Alder reaction as stated below, and correspond to the ingredient (c-2) in the invention. Preferred copolymers contain at least a unit shown by the following formula (VII) or contain this unit and a unit shown by the following formula (VIII):

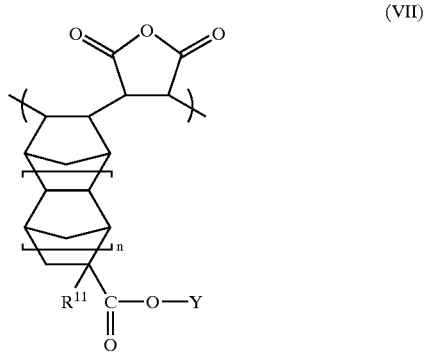

(VII)

wherein $R^{11}$ is a hydrogen atom or a lower alkyl group (for example those each having 1 to 3 carbon atoms); Y is an acid-decomposable group; and n is 0 or 1,

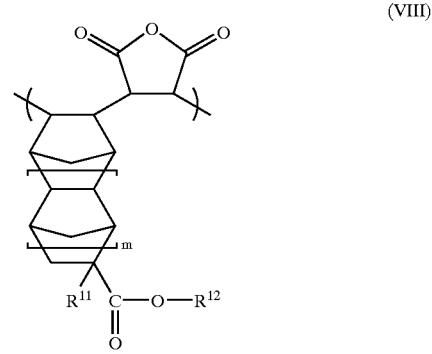

(VIII)

wherein $R^{11}$ has the same meaning as defined above; $R^{12}$ is an alkyl group having at least one hydroxyl group; and m is 0 or 1.

In the formula (VII), Y is formed by eliminating an ester moiety of the acid-decomposable group, and preferable Y includes, for example, tert-butyl group, 1-methyl-1-cyclohexyl group, 1-ethyl-1-cyclohexyl group, and other tertiary alkyl groups; and tetrahydropyranyl group, and other cyclic ether groups. Among them, 1-ethyl-1-cyclohexyl group is typically preferred as it can yield a high sensitivity and can be easily synthesized at low costs.

In the formula (VIII), $R^{12}$ is a functional group for improving adhesion between the resist layer and a silicon wafer or a silicon wafer on which an inorganic layer is formed, and is not limited as far as the group is an alkyl group having at least one hydroxyl group. The group $R^{12}$ is preferably a lower monohydroxyalkyl group or a lower dihydroxyalkyl group having 1 to 10 carbon atoms and one or two hydroxyl groups. Typical examples of such groups are hydroxymethyl group, hydroxyethyl group, hydroxypropyl group, hydroxybutyl group, dihydroxybutyl group, and hydroxypentyl group, of which 2-hydroxypropyl group and 2,3-dihydroxybutyl group are preferred. Such units of the formula (VII) or (VIII) can be obtained in the following manner. An acrylic or methacrylic ester having an acid-decomposable dissolution-inhibiting group is subjected to a Diels-Alder reaction with cyclopentadiene or dicyclopentadiene to yield a product, and the product is dissolved in an appropriate organic solvent such as dioxane, or tetrahydrofuran with maleic anhydride, and adding an appropriate radical polymerization initiator to the solution to initiate a copolymerization. Such radical polymerization initiators include, for example, benzoyl peroxide, 2,2'-azobisisobutyronitrile, acetyl peroxide, and lauryl peroxide. In the above formulae, n and m are 0 when cyclopentadiene is used, and n and m are 1 when dicyclopentadiene is used.

The copolymerization ratio between maleic anhydride and the polycyclic olefin monomer having an acid-decomposable group is theoretically each 50% by mole. However, copolymerization between maleic anhydride molecules with each other or between polycyclic olefin monomer molecules with each other occurs in actual, and the resulting copolymer actually contains 40% to 60% by mole of a unit derived from maleic anhydride and 40% to 60% by mole of a unit derived from the polycyclic olefin monomer.

When the copolymer (2) comprises the unit of the formula (VII) and the unit of the formula (VIII), the copolymer contains 40% to 90% by mole, and preferably 50% to 80% by mole of the unit of the formula (VII), and 10% to 60% by mole, and preferably 20% to 50% by mole of the unit of the formula (VIII). If the proportion of the unit of the formula (VII) is less than this range, the sensitivity will be decreased, and if the proportion exceeds this range, the adhesion to a substrate will be deteriorated.

The copolymer (2) preferably has a weight average molecular weight in a range from 2000 to 20000, and more preferably in a range from 3000 to 6000.

(3) Acrylic polymers having a (meth)acrylic acid unit having an acid-decomposable dissolution-inhibiting group and having no hydroxy(α-methyl)styrene unit:

Such acrylic polymers (3) include acrylic or methacrylic polymers or copolymers each having a constitutive unit shown by the following formula (IX):

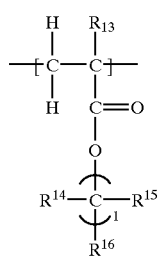

(IX)

The constitutive unit of the formula (IX) is derived from an acrylic or methacrylic ester shown by the following formula (X):

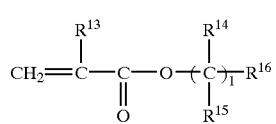

(X)

wherein $R^{13}$ is a hydrogen atom or a methyl group; each of $R^{14}$ and $R^{15}$ is a lower alkyl group; $R^{16}$ is a residue formed by eliminating one hydrogen atom bonded to a carbon atom of a compound selected from a lactone compound, a ketone compound, and an ester compound; and 1 is 0 or 1. This acrylic or methacrylic ester can be obtained by esterifying acrylic acid or methacrylic acid with, for example, a corresponding alcohol. These acrylic or methacrylic esters can be easily obtained at low costs and are suitable for mass production.

In the formulae (IX) and (X), the lower alkyl groups shown by $R^{14}$ and $R^{15}$ are preferably straight- or branched-chain alkyl groups having 1 to 4 carbon atoms. Such alkyl groups include, for example, methyl group, ethyl group, n-propyl group, isopropyl group, n-butyl group, isobutyl group, sec-butyl group, and tert-butyl group. Both the substituents $R^{14}$ and $R^{15}$ are preferably methyl groups.

In the substituent $R^{16}$, preferred residues formed by eliminating one hydrogen atom bonded to a carbon atom of a lactone compound are γ-butyrolactone residue, δ-valerolactone residue, and residues of derivatives of these lactones. Such derivatives include, but are not limited to, methyl group-, ethyl group-, and other lower alkyl-substituted derivatives, methoxy group-, ethoxy group-, and other lower alkoxy-substituted derivatives, compounds each having plural oxygen atoms on a lactone ring, compounds each having a methoxycarbonyl group or an acyl group bonded to a lactone ring. Among them, γ-butyrolactone residue or γ-butyrolactone residue having a lower alkyl group or a lower alkoxy group is preferred.

Such alcohol moieties each having the lactone residue in the acrylic or methacrylic ester of the formula (X) include, but are not limited to, compounds shown by the following formulae:

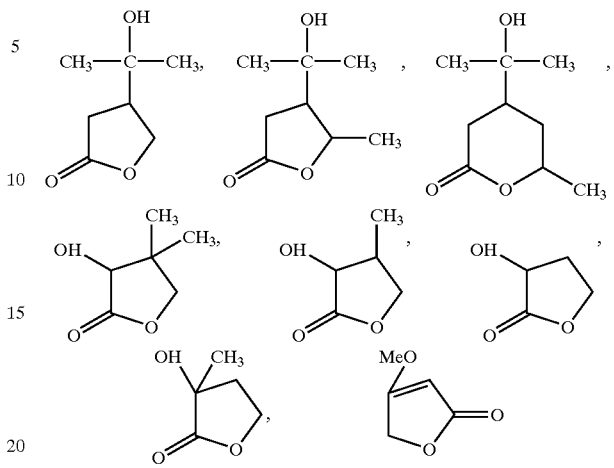

Among them, alcohols each having a five-membered lactone reside are preferred. In the substituent $R^{16}$, the residue formed by eliminating one hydrogen atom bonded to a carbon atom of a ketone compound is preferably a residue of a ketone compound having 2 to 10 carbon atoms, and is typically preferably an acetonyl group.

Preferred alcohol moiety having the ketone compound residue in the acrylic or methacrylic ester of the formula (X) is, for example, 4-hydroxy-4-methyl-2-pentanone (diacetone alcohol) shown by the following formula:

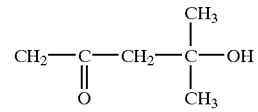

In the substituent $R^{16}$, residues formed by eliminating one hydrogen atom bonded to a carbon atom of an ester compound include, for example, methoxycarbonyl group, ethoxycarbonyl group, propoxycarbonyl group, and other lower-alkoxy-carbonyl groups, and lower-alkoxy-carbonylmethyl groups.

Preferred alcohol moiety having the ester compound residue in the acrylic or methacrylic ester of the formula (X) is, for example, alkyl esters of 2-hydroxy-2-methylpropionic acid shown by the following formula:

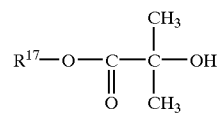

wherein $R^{17}$ is a lower alkyl group.

The acrylic polymer (3) should preferably contain 20% to 80% by mole, and more preferably 40% to 70% by mole of the constitutive unit of the formula (IX) to improve sensitivity, definition, transparency, adhesion, and affinity for alkalis in balance.

The acrylic polymer (3) may be obtained by polymerizing the (meth)acrylic ester of the formula (X) but should be preferably obtained by copolymerizing the (meth)acrylic ester of the formula (X) with an additional monomer shown below in such a manner that the proportion of the constitutive unit of the formula (IX) falls in the above range.

Such additional monomers to be copolymerized include known (meth)acrylic acid derivatives (hereinafter referred to as "first monomer") each having a protective group such as a group for improving dry etching resistance or an acid-decomposable group which are employed for chemically amplified positive photoresists for ArF laser; (meth)acrylic acid, maleic acid, fumaric acid, and other carboxylic acids (hereinafter referred to as "second monomer") each having an ethylenic double bond to make the resulting copolymer soluble in alkalis; and known monomer ingredients (hereinafter referred to as "third monomer") for use in acrylic resins. Each of these additional monomers can be used alone or in combination.

The first monomers include, but are not limited to, tert-butyl (meth)acrylate, tetrahydropyranyl (meth)acrylate, tetrahydrofuranyl (meth)acrylate, 1-methylcyclohexyl (meth)acrylate, 1-methyladamantyl (meth)acrylate, ethoxyethyl (meth)acrylate, methoxypropyl (meth)acrylate, (meth)acrylic ester of 2-hydroxy-3-pinanone, and other (meth)acrylic esters in which a hydroxyl group of a carboxyl group is protected with an acid-decomposable substituent; adamantyl (meth)acrylate, cyclohexyl (meth)acrylate, naphthyl (meth)acrylate, benzyl (meth)acrylate, 3-oxocyclohexyl (meth)acrylate, bicyclo[2.2.1]heptyl (meth)acrylate, tricyclodecanyl (meth)acrylate, (meth)acrylic ester of terpineol, (meth)acrylic ester of 3-bromoacetone, and other monomers in which a hydroxyl group of a carboxyl group is protected with a non-acid-decomposable substituent.

Such first monomers can be shown by, for example, the following formula:

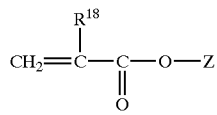

wherein $R^{18}$ is a hydrogen atom or a methyl group; and Z is a tert-butyl group, an ethoxyethyl group, a methoxypropyl group, a terpineol residue, or a group shown by:

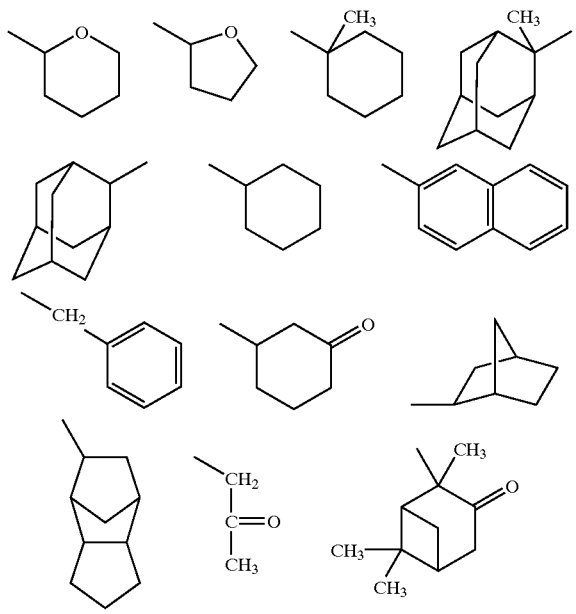

The second monomers include, for example, (meth)acrylic acid, maleic acid, and fumaric acid, of which (meth)acrylic acid is preferred. The third monomers include, but are not limited to, (a) methyl (meth)acrylate, ethyl (meth)acrylate, propyl (meth)acrylate, isopropyl (meth)acrylate, n-butyl (meth)acrylate, isobutyl (meth)acrylate, n-hexyl (meth)acrylate, octyl (meth)acrylate, 2-ethylhexyl (meth)acrylate, lauryl (meth)acrylate, 2-hydroxyethyl (meth)acrylate, 2-hydroxypropyl (meth)acrylate, and other alkyl esters; (b) (meth)acrylamide, N-methylol(meth)acrylamide, diacetone acrylamide, and other amides; and (c) acrylonitrile, methacrylonitrile, vinyl chloride, and ethyl vinyl ether.

The preferred acrylic polymer (3) is a copolymer obtained by polymerizing the monomer of the formula (X) and at least one selected from the first, second, and third monomers. Of these polymers (1), (2) and (3), the polymer (1) can be easily obtained at low costs and is advantageously employed in the invention.

The proportion of the ingredient (C) is about 10 to 400 parts by weight relative to 100 parts by weight of the ingredient (B). When the low-molecular-weight compound (c-1) is used as the ingredient (C), the proportion of the ingredient (c-1) is preferably 10 to 50 parts by weight relative to 100 parts by weight of the ingredient (B). Within this range, the resulting resist composition can form a resist pattern having a high definition and a satisfactory dry etching resistance. When the polymer (c-2) is used as the ingredient (C), the proportion of the ingredient (c-2) is preferably 20 to 200 parts by weight relative to 100 parts by weight of the ingredient (B). Within this range, the resulting resist composition can form a resist pattern having a high definition and a satisfactory dry etching resistance.

The invented positive resist composition may further comprise various additives where necessary. Such additives include, for example, (D) known aliphatic lower amines for improving time delay (stability of latent image after exposure), and (E) organic carboxylic acids or oxoacids of phosphorus or derivatives thereof for inhibiting decrease of sensitivity or improving substrate-dependency.

Such aliphatic lower amines include, but are not limited to, diethylamine, triethylamine, n-propylamine, di-n-propylamine, tri-n-propylamine, triisopropanolamine, isopropylamine, tributylamine, tripentylamine, triethanolamine, dipropanolamine, and tripropanolamine. Among them, tertiary aliphatic lower amines are preferred.

The organic carboxylic acids include, but are not limited to, saturated or unsaturated aliphatic carboxylic acids, alicyclic carboxylic acids, aromatic carboxylic acids, and other organic carboxylic acids. Such saturated aliphatic carboxylic acid include, for example, formic acid, acetic acid, propionic acid, butyric acid, isobutyric acid, oxalic acid, malonic acid, succinic acid, glutaric acid, adipic acid, and other mono- or poly-carboxylic acids. The unsaturated aliphatic carboxylic acids include, for example, acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid. The alicyclic carboxylic acids include, but are not limited to, 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexyldiacetic acid. The aromatic carboxylic acids include, but are not limited to, p-hydroxybenzoic acid, o-hydroxybenzoic acid, 2-hydroxy-3-nitrobenzoic acid, phthalic acid, terephthalic acid, isophthalic acid, and other aromatic carboxylic acids having a hydroxyl group, nitro group, carboxyl group or other substituents.

Illustrative oxoacids of phosphorus or derivatives thereof include, but are not limited to, phosphoric acid, phosphorous acid, di-n-butyl phosphate, diphenyl phosphate, and other phosphoric acid, phosphorous acid, esters and other derivatives of these acids; phosphonic acid, dimethyl phosphonate, di-n-butyl phosphonate, phenyl phosphonate, diphenyl phosphonate, dibenzyl phosphonate, and other phosphonic acid, esters and other derivatives thereof; phosphinic acid, phenyl phosphinate, and other phosphinic acid, esters and other derivatives thereof.

The proportion of the aliphatic amine (D) is preferably 0.01 to 1.0 part by weight, and more preferably 0.05 to 0.5 part by weight, relative to 100 parts by weight of the ingredient (B). Within this range, the resulting resist composition can form a resist pattern with an improved profile and exhibit an enhanced sensitivity.

The proportion of the organic carboxylic acid, or an oxoacid of phosphorus or its derivative (E) is preferably 0.01 to 1.0 part by weight, and more preferably 0.05 to 0.5 part by weight, relative to 100 parts by weight of the ingredient (B). Within this range, the resulting resist composition can exhibit improved definition and sensitivity.

The invented positive resist composition may further comprise any of compatible additives including, for example, inhibitors of halation and surfactants, according to necessity.

The invented positive resist composition may preferably be used as a solution prepared by dissolving each of the ingredients in an appropriate solvent. Such solvents include solvents conventionally used for positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers, and other polyhydric alcohols and derivatives thereof; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination.

Practically, the invented photosensitive laminate and positive resist composition are preferably used in the following manner. A solution of the positive resist composition is applied, using a spinner or the like, onto a substrate such as a silicon wafer or the silicon wafer on which a thin film such as a polycrystalline silicon, TiN, SiON, phospho-silicate glass (PSG), boro-phospho-silicate glass (BPSG), SiN, or $Si_3N_4$ has been formed in accordance with a target semiconductor device. The coated solution is then dried to form a photosensitive layer to thereby yield a photosensitive laminate; next, the photosensitive layer is exposed through a desired patterned photomask; then, the photosensitive layer is post-exposure baked (PEB); and the exposed areas of the photosensitive layer are then dissolved and removed by dipping the base in a developer solution, for example, an alkaline aqueous solution such as a 1% to 10% by weight tetramethylammonium hydroxide (TMAH) aqueous solution, thus forming an image being in exact accordance with the mask pattern. To further improve the definition of resist pattern, an inorganic or organic antireflection coat may be formed between the substrate and the photosensitive layer formed by using the invented composition. The antireflection coat generally has a thickness of 30 to 300 nm.

According to the invention, resist patterns can be formed by a conventional lithography process with KrF excimer laser irradiation or light having a short wavelength equal to or less than that of $F_2$ laser, using the above positive resist composition. Specifically, resist patterns can be formed by subjecting the photosensitive laminate to selective exposure to KrF excimer layer light or light having a short wavelength equal to or less than that of $F_2$ laser, to post-exposure baking, and to development with an alkali.

The thickness of the resist layer formed on the substrate should fall in a range of 500 to 5800 angstroms, preferably 500 to 5000 angstroms, more preferably 500 to 4000 angstroms, and optimally 500 to 3000 angstroms. The thinner the resist layer is, the more the invention exhibits satisfactory advantages.

A thickness of the resist layer less than 500 angstroms will deteriorate dry etching resistance of the resulting resist pattern. In contrast, a thickness exceeding 5800 angstroms will deteriorate the definition and profile (cross sectional shape) of the resulting resist pattern.

A resist layer having a thickness of 4500 to 5500 angstroms is advantageous as a resist for ion implantation in which an especially high dry etching resistance is required.

The thickness of the resist layer of the invented photosensitive laminate can be appropriately selected depending on the type of light to be exposed. When KrF excimer laser light is used, the thickness is in a range of 1000 to 5800 angstroms, preferably 1000 to 5000 angstroms, more preferably 1000 to 4000 angstroms, and optimally 1000 to 3000 angstroms.

When light having a short wavelength equal to or less than that of $F_2$ laser is employed, the thickness is preferably 500 to 1000 angstroms, and more preferably 500 to 900 angstroms. In such an ultrathin resist layer, a fine resist pattern of 0.15 µm or less can be applied by forming a hard mask layer as an etching-stopper layer between a layer to be etched and the resist layer on the substrate.

EXAMPLES

The present invention will be further illustrated in detail with reference to several invented examples and a comparative example below.

Example 1

Ingredient (A): bis(4-tert-butylphenyl)iodonium nonafluorobutanesulfonate

Ingredient (B): a cresol novolak resin having a weight average molecular weight of 18000 obtained by condensing a cresol mixture containing 40% by mole of m-cresol and 60% by mole of p-cresol with formaldehyde in the presence of oxalic acid catalyst Ingredient (C): a compound obtained by reacting 1 mole of bis(3-cyclohexyl-4-hydroxy-6-methylphenyl)-4-hydroxyphenylmethane with 2 moles of tert-butyl bromoacetate to substitute part of hydroxyl groups of the former compound with tert-butoxycarbonylmethyloxy groups Ingredient (D): triethanolamine Ingredient (E): salicylic acid In 1070 parts by weight of methyl amyl ketone, 2.67 parts by weight of the ingredient (A), 100 parts by weight of the ingredient (B), 20 parts by weight of the ingredient (C), 0.27 part by weight of the ingredient (D), and 0.27 part by weight of the ingredient (E) were dissolved, and the resulting solution was filtrated though a 0.2-µm membrane filter to yield a positive resist solution.

The above-prepared positive resist solution was applied, using a spinner, on a 6-inch silicon wafer treated with hexamethyldisilazane, and was dried on a hot plate at 90° C.

for 90 seconds to form a resist layer having a thickness of 2500 angstroms. The resist layer was then selectively irradiated with KrF excimer laser light using a reducing-type projection aligner FPA-3000 EX3 (manufactured by Canon Inc., Japan; NA=0.6). The resist layer was then post-exposure baked (PEB) at 110° C. for 90 seconds; and was subjected to puddle developing in a 2.38% by weight tetramethylammonium hydroxide aqueous solution for 60 seconds to yield a positive resist pattern.

A pattern with a 0.20μm line-and-space was thus resolved, and the resist pattern had a good profile rising perpendicularly from the substrate.

In this procedure, the minimum exposure (sensitivity) to reproduce a 0.20-μm resist pattern was 31 mJ/cm$^2$, and the critical definition was 0.18 μm. The resist pattern exhibited a satisfactory dry etching resistance.

Example 2

The resist patterning procedure of Example 1 was repeated, except that the thickness of the resist layer was changed to 1800 angstroms.

A pattern with a 0.20-μm line-and-space was thus resolved, and the resist pattern had a good profile rising perpendicularly from the substrate. In this procedure, the minimum exposure (sensitivity) to reproduce a 0.20-μm resist pattern was 28 mJ/cm$^2$, and the critical definition was 0.17 μm. The resist pattern exhibited a satisfactory dry etching resistance.

Example 3

A positive resist solution was prepared in the same manner as in Example 1, except that the ingredient (C) used in Example 1 was changed to 20 parts by weight of a compound in which all the carboxyl groups of 3,4,3',4'-biphenyltetracarboxylic acid were converted into tert-butyl esters.

The above-prepared resist solution was then subjected to resist patterning in the same manner as in Example 1.

A pattern with a 0.20-μm line-and-space was thus resolved, and the resist pattern had a tapered profile which did not adversely affecting the quality of the product. In this procedure, the minimum exposure (sensitivity) to reproduce a 0.20-μm resist pattern was 50 mJ/cm$^2$, and the critical definition was 0.18 μm. The resist pattern exhibited a satisfactory dry etching resistance.

Example 4

A positive resist solution was prepared in the same manner as in Example 1, except that the ingredient (C) used in Example 1 was changed to 50 parts by weight of a compound in which the carboxyl group of benzoic acid was substituted with a 1-ethoxyethyloxycarbonyl group.

The above-prepared resist solution was then subjected to resist patterning in the same manner as in Example 1.

A pattern with a 0.20-μm line-and-space was thus resolved, and the resist pattern had a tapered shape which did not adversely affecting the quality of the product. In this procedure, the minimum exposure (sensitivity) to reproduce a 0.20-μm resist pattern was 32 mJ/cm$^2$, and the critical definition was 0.19 μm. The resist pattern exhibited a satisfactory dry etching resistance.

Example 5

A positive resist solution was prepared in the same manner as in Example 1, except that the ingredient (C) used in Example 1 was changed to 20 parts by weight of a compound of the following formula.

The above-prepared resist solution was then subjected to resist patterning in the same manner as in Example 1.

A pattern with a 0.20-μm line-and-space was thus resolved, and the resist pattern had a good profile rising perpendicularly from the substrate. In this procedure, the minimum exposure (sensitivity) to reproduce a 0.20-μm resist pattern was 40 mJ/cm$^2$, and the critical definition was 0.17 μm. The resist pattern exhibited a satisfactory dry etching resistance.

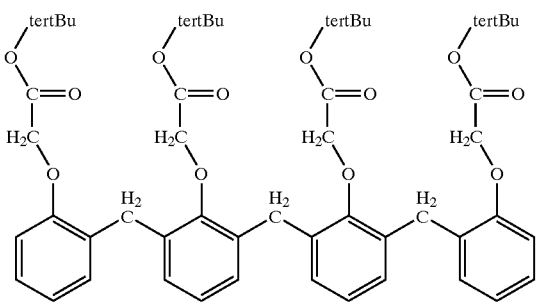

Example 6

The resist patterning procedure of Example 1 was repeated, except that the thickness of the resist layer was changed to 0.5 μm.

A pattern with a 0.25-μm line-and-space was thus resolved, and the resist pattern had a trapezoidal shape. In this procedure, the minimum exposure (sensitivity) to reproduce a 0.25-μm resist pattern was 40 mJ/cm$^2$, and the critical definition was 0.20 μm. The resist pattern exhibited a satisfactory dry etching resistance.

Example 7

Ingredient (A): bis(4-tert-butylphenyl)iodonium nonafluorobutanesulfonate

Ingredient (B): a cresol novolak resin having a weight average molecular weight of 23000 and obtained by condensing a cresol mixture containing 60% by mole of m-cresol and 40% by mole of p-cresol with formaldehyde in the presence of oxalic acid catalyst Ingredient (C): a copolymer having a weight average molecular weight of 12000 and obtained from 60% by mole of a hydroxystyrene unit and 40% by mole of a tert-butyl acrylate unit Ingredient (D): triethanolamine Ingredient (E): salicylic acid In 1070 parts by weight of methyl amyl ketone, 2.67 parts by weight of the ingredient (A), 50 parts by weight of the ingredient (B), 50 parts by weight of the ingredient (C), 0.12 part by weight of the ingredient (D), and 0.12 part by weight of the ingredient (E) were dissolved, and the resulting solution was filtrated though a 0.2-μm membrane filter to yield a positive resist solution.

The above-prepared positive resist solution was applied, using a spinner, on a 6-inch silicon wafer treated with hexamethyldisilazane, and was dried on a hot plate at 100° C. for 60 seconds to form a resist layer having a thickness of 5400 angstroms. The resist layer was then selectively irradiated with KrF excimer laser light using a reducing-type projection aligner FPA-3000 EX3 (manufactured by Canon Inc., Japan; NA=0.6). The resist layer was then post-exposure baked (PEB) at 110° C. for 60 seconds; and was subjected to puddle developing in a 2.38% by weight tetramethylammonium hydroxide aqueous solution for 60 seconds to yield a positive resist pattern.

The pattern with a 0.30 µm line-and-space was thus resolved. The resist pattern had a good shape rising perpendicularly from the substrate, but some standing waves were observed.

In this procedure, the minimum exposure (sensitivity) to reproduce a 0.30-µm resist pattern was 17 mJ/cm$^2$, and the critical definition was 0.20 µm. The resist pattern exhibited a satisfactory dry etching resistance.

Example 8

Ingredient (A): triphenylsulfonium trifluoromethanesulfonate

Ingredient (B): the same cresol novolak resin with the ingredient (B) used in Example 1

Ingredient (C): the following compound

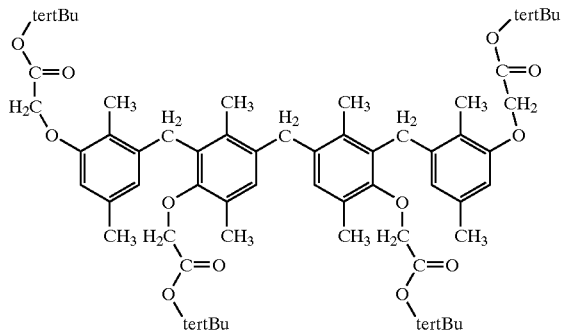

Additional ingredient: triisopropanolamine

In 1660 parts by weight of propylene glycol monomethyl ether monoacetate, 3 parts by weight of the ingredient (A), 100 parts by weight of the ingredient (B), 25 parts by weight of the ingredient (C), and 0.3 part by weight of the additional ingredient were dissolved, and the resulting solution was filtrated though a 0.1-µm membrane filter to yield a positive resist solution.

The above-prepared positive resist solution was applied, using a spinner, on a 6-inch silicon wafer, and was dried on a hot plate at 90° C. for 90 seconds to form a resist layer having a thickness of 800 angstroms.

The resist layer was then selectively irradiated with $F_2$ excimer laser light (157 nm) using a contact aligner VUVES-4500 (manufactured by Litho Tech Japan Corporation). The resist layer was then post-exposure baked (PEB) at 110° C. for 90 seconds; and was subjected to puddle developing in a 2.38% by weight tetramethylammonium hydroxide aqueous solution for 60 seconds. The resist layer was then rinsed with pure water for 30 seconds to yield a positive resist pattern.

A pattern with a 180-nm line-and-space was thus resolved. The exposure in this procedure was 3 mJ/cm$^2$, and the resist pattern had a good shape near to rectangular shape. The resist pattern exhibited a satisfactory SEM resistance and dry etching resistance.

Example 9

A positive resist solution was prepared in the same manner as in Example 8, except that tert-butyl ester of lithocholic acid at the same amount was used instead of the ingredient (C) used in Example 8.

Next, the resist patterning procedure of Example 8 was repeated to yield a pattern with a 180-nm line-and-space. The exposure in this procedure was 3 mJ/cm$^2$, and the resist pattern had a good shape near to rectangular shape. The resist pattern exhibited a satisfactory SEM resistance and dry etching resistance.

Comparative Example 1

The resist patterning procedure of Example 1 was repeated, except that the thickness of the resist layer was changed to 0.7 µm.

A pattern with a 0.35-µm line-and-space was thus resolved, and the resist pattern had an undesirable triangle shape. In this procedure, the minimum exposure (sensitivity) to reproduce a 0.35-µm resist pattern was 50 mJ/cm$^2$, and the critical definition was 0.28 µm.

As thus described, the invention provides a photosensitive laminate which is available at low costs and can form a resist pattern with a good profile and has a satisfactory dry etching resistance, a high definition, and an excellent SEM resistance. This photosensitive laminate is typically advantageously used for KrF laser or light having a short wavelength equal to or less than that of $F_2$ laser. The invention further provides a process for forming a resist pattern using the photosensitive laminate, and a positive resist composition.

Other embodiments and variations will be obvious to those skilled in the art, and this invention is not to be limited to the specific matters stated above.

What is claimed is:

1. A photosensitive laminate comprising:
    a substrate, and
    a resist layer having a thickness of 500 to 5800 angstroms and being formed on said substrate, said resist layer being formed from a positive resist composition, and said positive resist composition comprising:
    (A) a compound which generates an acid upon irradiation with radioactive ray,
    (B) an alkali-soluble novolak resin, and
    (C) a compound having at least one acid-decomposable dissolution-inhibiting group, said dissolution-inhibiting group being decomposable by action of an acid generated from said ingredient (A) to yield an organic carboxylic acid.

2. A photosensitive laminate according to claim 1, wherein said resist layer has a thickness of 500 to 4000 angstroms.

3. A photosensitive laminate according to claim 1, wherein said ingredient (C) is (c-1) a compound having a weight average molecular weight in a range from 100 to 1500.

4. A photosensitive laminate according to claim 3, wherein said ingredient (c-1) is a compound having 1 to 6 substituted or unsubstituted benzene nuclei and having at least one acid-decomposable dissolution-inhibiting group.

5. A photosensitive laminate according to claim 3, wherein said ingredient (c-1) is a bile acid ester having at least one acid-decomposable dissolution-inhibiting group.

6. A photosensitive laminate according to claim 4, wherein said ingredient (c-1) is a compound in which a hydrogen atom of at least one hydroxyl group or carboxyl group of a compound (c-1-1) shown by the following formula (I) is substituted with an acid-decomposable dissolution-inhibiting group:

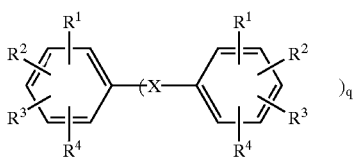

(I)

wherein each of $R^1$, $R^2$, $R^3$, and $R^4$ is independently a hydrogen atom, a straight- or branched-chain or cyclic alkyl group having 6 or less carbon atoms, a lower alkoxy group, a hydroxyl group, a carboxyl group, or an alkyl group containing a carboxyl group; X is a single bond, —C(O)—, or —C($R^5$)($R^6$)—, where $R^5$ is a hydrogen atom or a lower alkyl group, and $R^6$ is a hydrogen atom, a lower alkyl group, a carboxyl group, an alkyl group containing a carboxyl group, or an aryl group shown by the following formula (II); q is 0 or 1, and the group in a parenthesis in the formula (I) is a hydrogen atom when q is 0:

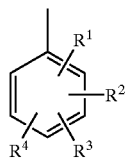

(II)

wherein $R^1$, $R^2$, $R^3$, and $R^4$ have the same meanings as defined above.

7. A photosensitive laminate according to claim 4, wherein said ingredient (c-1) is (c-1-2) a compound which is a condensate of formaldehyde and at least one selected from the group consisting of phenol, m-cresol, p-cresol and xylenol, and at least one hydrogen atom of hydroxyl groups of said compound is substituted with a tert-butoxycarbonylalkyl group.

8. A photosensitive laminate according to claim 1, wherein said ingredient (C) is (c-2) a polymer containing at least 2% by mole of a (meth)acrylic acid derivative unit having an acid-decomposable dissolution-inhibiting group, and having a weight average molecular weight in a range from 2000 to 20000.

9. A photosensitive laminate according to claim 8, wherein said ingredient (c-2) is a copolymer comprising 50% to 70% by mole of (c-2-1) a hydroxy(α-methyl)styrene unit and 30% to 50% by mole of (c-2-2) a (meth)acrylic acid derivative unit having an acid-decomposable dissolution-inhibiting group.

10. A photosensitive laminate according to claim 1, wherein said acid-decomposable dissolution-inhibiting group is at least one selected from the group consisting of tertiary alkoxycarbonyl groups, tertiary alkoxycarbonylalkyl groups, tertiary alkyl groups, cyclic ether groups, alkoxyalkyl groups, and 1-alkylcycloalkyl groups.

11. A photosensitive laminate according to claim 10, wherein said acid-decomposable dissolution-inhibiting group is at least one selected from the group consisting of a tert-butoxycarbonyl group, a tert-butoxycarbonylmethyl group, a tert-butyl group, a tetrahydropyranyl group, an ethoxyethyl group, a 1-methylcyclohexyl group, and a 1-ethylcyclohexyl group.

12. A photosensitive laminate according to claim 8, wherein said acid-decomposable dissolution-inhibiting group is at least one selected from the group consisting of tertiary alkyl groups, cyclic ether groups, alkoxyalkyl groups, and 1-alkylcycloalkyl groups.

13. A photosensitive laminate according to claim 12, wherein said acid-decomposable dissolution-inhibiting group is at least one selected from the group consisting of a tert-butyl group, a tetrahydropyranyl group, an ethoxyethyl group, a 1-methylcyclohexyl group, and a 1-ethylcyclohexyl group.

14. A photosensitive laminate according to claim 1, wherein said positive resist composition further comprises (D) an aliphatic lower amine in a proportion of 0.01 to 1.0 part by weight relative to 100 parts by weight of said ingredient (B).

15. A photosensitive laminate according to claim 1, wherein said positive resist composition further comprises (E) an organic carboxylic acid or an oxoacid of phosphorus or its derivative in a proportion of 0.01 to 1.0 part by weight relative to 100 parts by weight of said ingredient (B).

16. A process for forming a resist pattern, comprising the step of:
    sequentially subjecting the photosensitive laminate of claim 1 to selective exposure to KrF excimer laser, post exposure baking, and development with an alkali.

17. A process according to claim 16, wherein said photosensitive laminate is the photosensitive laminate having a resist layer 1000 to 5800 angstroms thick.

18. A process for forming a resist pattern, comprising the step of:
    sequentially subjecting the photosensitive laminate of claim 1 to selective exposure to light having a wavelength equal to or less than that of $F_2$ laser (157 nm), post exposure baking, and development with an alkali.

19. A process according to claim 18, wherein said photosensitive laminate is the photosensitive laminate of one of claims 1 to 14 having a resist layer 500 to 1000 angstroms thick.

20. A positive resist composition comprising:
    (A) a compound which generates an acid upon irradiation with radioactive ray,
    (B) an alkali-soluble novolak resin, and
    (C) a compound having at least one acid-decomposable dissolution-inhibiting group, said dissolution-inhibiting group being decomposable by action of an acid generated from said ingredient (A) to yield an organic carboxylic acid,
        wherein said ingredient (C) is a bile acid ester having a weight average molecular weight in a range from 100 to 1500 and containing at least one acid-decomposable dissolution-inhibiting group.

21. A positive resist composition comprising:
    (A) a compound which generates an acid upon irradiation with radioactive ray,
    (B) an alkali-soluble novolak resin, and
    (C) a compound having at least one acid-decomposable dissolution-inhibiting group, said dissolution-inhibiting group being decomposable by action of an acid generated from said ingredient (A) to yield an organic carboxylic acid,
        wherein said ingredient (C) concurrently satisfies both the following conditions (c-1) and (c-1-1).
        (c-1): being a compound having a weight average molecular weight in a range from 100 to 1500, and
        (c-1-1): being a compound in which a hydrogen atom of at least one hydroxyl group or carboxyl group of a compound shown by the following formula (I) is substituted with an acid-decomposable dissolution-inhibiting group:

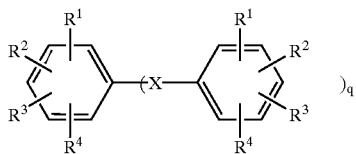

(I)

wherein each of $R^1$, $R^2$, $R^3$, and $R^4$ is independently a hydrogen atom, a straight- or branched chain, or cyclic alkyl group having 6 or less carbon atoms, a lower alkoxy group, a hydroxyl group, a carboxyl group, or an alkyl group containing a carboxyl group; X is a single bond, —C(O)—, or —C($R^5$)($R^6$)—, where $R^5$ is a hydrogen atom or a lower alkyl group, and $R^6$ is a hydrogen atom, a lower alkyl group, a carboxyl group, an alkyl group containing a carboxyl group, or an aryl group shown by the following formula (II); q is 0 or 1, and the group in a parenthesis in the formula (I) is a hydrogen atom when q is 0:

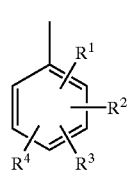

(II)

wherein $R^1$, $R^2$, $R_3$ and $R^4$ have the same meanings as defined above.

22. A positive photoresist composition comprising:
(A) a compound which generates an acid upon irradiation with radioactive ray,
(B) an alkali-soluble novolak resin, and
(C) a compound having at least one acid-decomposable dissolution-inhibiting group, said dissolution-inhibiting group being decomposable by action of an acid generated from said ingredient (A) to yield an organic carboxylic acid,
wherein said ingredient (C) concurrently satisfies both the following conditions (c-1') and (c-1-2).
  (c-1'): being a compound having a weight average molecular weight in a range from 100 to 1500, containing 1 to 6 substituted or unsubstituted benzene nuclei, and having at least one acid-decomposable dissolution-inhibiting group; and
  (c-1-2): being a compound which is a condensate of formaldehyde and at least one selected from the group consisting of phenol, m-cresol, p-cresol and xylenol, and at least one hydrogen atom of hydroxyl groups of said compound is substituted with a tert-butoxycarbonylalkyl group.

23. A positive photoresist composition comprising:
(A) a compound which generates an acid upon irradiation with radioactive ray,
(B) an alkali-soluble novolak resin, and
(C) a compound having at least one acid-decomposable dissolution-inhibiting group, said dissolution-inhibiting group being decomposable by action of an acid generated from said ingredient (A) to yield an organic carboxylic acid,
wherein said ingredient (C) satisfies the following condition (c-2):
  (c-2): being a polymer containing at least 2% by mole of a (meth)acrylic acid derivative unit having an acid-decomposable dissolution-inhibiting group and having a weight average molecular weight in a range from 2000 to 20000.

24. A positive resist composition according to claim 23, wherein said polymer (c-2) is a copolymer comprising 50% to 70% by mole of (c-2-1) a hydroxy(α-methyl)styrene unit and 30% to 50% by mole of (c-2-2) a (meth)acrylic acid derivative unit having an acid-decomposable dissolution-inhibiting group.

25. A positive resist composition according to claim 20, wherein said acid-decomposable dissolution-inhibiting group is at least one selected from the group consisting of tertiary alkoxycarbonyl groups, tertiary alkoxycarbonylalkyl groups, tertiary alkyl groups, cyclic ether groups, alkoxyalkyl groups, and 1-alkylcycloalkyl groups.

26. A positive resist composition according to claim 25, wherein said acid-decomposable dissolution-inhibiting group is at least one selected from the group consisting of a tert-butoxycarbonyl group, a tert-butoxycarbonylmethyl group, a tert-butyl group, a tetrahydropyranyl group, an ethoxyethyl group, a 1-methylcyclohexyl group, and a 1-ethylcyclohexyl group.

27. A positive resist composition according to claim 23, wherein said acid-decomposable dissolution-inhibiting group is at least one selected from the group consisting of a tertiary alkyl group, a cyclic ether group, an alkoxyalkyl group, and a 1-alkylcycloalkyl group.

28. A positive resist composition according to claim 27, wherein said acid-decomposable dissolution-inhibiting group is at least one selected from the group consisting of a tert-butyl group, a tetrahydropyranyl group, an ethoxyethyl group, a 1-methylcyclohexyl group, and a 1-ethylcyclohexyl group.

29. A positive resist composition according to claim 20, further comprising (D) an aliphatic lower amine in a proportion of 0.01 to 1.0 part by weight relative to 100 parts by weight of said ingredient (B).

30. A positive resist composition according to claim 20, further comprising (E) an organic carboxylic acid or an oxoacid of phosphorous or its derivative in a proportion of 0.01 to 1.0 part by weight relative to 100 parts by weight of said ingredient (B).

31. A positive resist composition according to claim 21, wherein said acid-decomposable dissolution-inhibiting group is at least one selected from the group consisting of tertiary alkoxycarbonyl groups, tertiary alkoxycarbonylalkyl groups, tertiary alkyl groups, cyclic ether groups, alkoxyalkyl groups, and 1-alkylcycloalkyl groups.

32. A positive resist composition according to claim 21, further comprising (D) an aliphatic lower amine in a proportion of 0.01 to 1.0 part by weight relative to 100 parts by weight of said ingredient (B).

33. A positive resist composition according to claim 22, further comprising (D) an aliphatic lower amine in a proportion of 0.01 to 1.0 part by weight relative to 100 parts by weight of said ingredient (B).

34. A positive resist composition according to claim 23, further comprising (D) an aliphatic lower amine in a proportion of 0.01 to 1.0 part by weight relative to 100 parts by weight of said ingredient (B).

35. A positive resist composition according to claim 21, further comprising (E) an organic carboxylic acid or an oxoacid of phosphorous or its derivative in a proportion of 0.01 to 1.0 part by weight relative to 100 parts by weight of said ingredient (B).

36. A positive resist composition according to claim 22, further comprising (E) an organic carboxylic acid or an oxoacid of phosphorous or its derivative in a proportion of 0.01 to 1.0 part by weight relative to 100 parts by weight of said ingredient (B).

37. A positive resist composition according to claim 23, further comprising (E) an organic carboxylic acid or an oxoacid of phosphorous or its derivative in a proportion of 0.01 to 1.0 part by weight relative to 100 parts by weight of said ingredient (B).

* * * * *